United States Patent [19]

Bardsley, Jr. et al.

[11] Patent Number: 5,761,072
[45] Date of Patent: Jun. 2, 1998

[54] BATTERY STATE OF CHARGE SENSING SYSTEM

[75] Inventors: David John Bardsley, Jr., Davisburg; Jing Song, Novi, both of Mich.

[73] Assignee: Ford Global Technologies, Inc., Dearborn, Mich.

[21] Appl. No.: 555,572

[22] Filed: Nov. 8, 1995

[51] Int. Cl.$^6$ .................................... G01R 19/00
[52] U.S. Cl. .................. 364/483; 340/636; 324/427; 320/48
[58] Field of Search ................. 364/483, 492, 364/550, 481; 395/750; 340/636; 324/426, 427, 428; 320/13, 20, 39, 43, 44, 48

[56] References Cited

U.S. PATENT DOCUMENTS

| | | | |
|---|---|---|---|
| 3,886,442 | 5/1975 | Chiku et al. | 324/427 |
| 4,390,841 | 6/1983 | Martin et al. | 324/427 |
| 4,595,880 | 6/1986 | Patil | 324/427 |
| 4,876,513 | 10/1989 | Brilmyer et al. | 324/427 |
| 4,952,862 | 8/1990 | Biagetti et al. | 320/48 |
| 5,281,919 | 1/1994 | Palanisamy | 324/427 |
| 5,321,627 | 6/1994 | Reher | 364/483 |
| 5,349,540 | 9/1994 | Birkle et al. | 364/578 |
| 5,371,682 | 12/1994 | Levine et al. | 364/483 |
| 5,381,096 | 1/1995 | Hirzel | 324/427 |
| 5,381,350 | 1/1995 | Fiorina et al. | 364/550 |
| 5,394,089 | 2/1995 | Clegg | 324/427 |
| 5,422,822 | 6/1995 | Toyota et al. | 364/483 |
| 5,539,318 | 7/1996 | Sasaki | 324/427 |
| 5,578,915 | 11/1996 | Crouch, Jr. et al. | 324/426 |
| 5,598,088 | 1/1997 | Richter | 320/48 |
| 5,614,829 | 3/1997 | Song | 324/427 |
| 5,631,540 | 5/1997 | Nguyen | 320/39 |
| 5,656,919 | 8/1997 | Proctor et al. | 320/48 |

*Primary Examiner*—Eric W. Stamber
*Attorney, Agent, or Firm*—Richard D. Dixon

[57] ABSTRACT

A microprocessor samples the net effective current from a battery several times a second. A fast average current $I_f$ is calculated using an IIR filter on the net average current. A slow average current $\bar{I}$ is calculated by integrating the net average current over time with respect to time. An Ampere Hour Capacity is calculated by the use of the Peukert equation, which is split into two terms. A first capacity term is calculated using the fast average current $I_f$ and a slow capacity term is calculated using the slow average current $\bar{I}$. The slow capacity term is then multiplied by a weighting constant $C_2$ and summed with the fast capacity term which is multiplied by $(1-C_2)$.

14 Claims, 2 Drawing Sheets

BATTERY STATE OF CHARGE SENSING SYSTEM

BACKGROUND OF THE INVENTION

1. Field of the Invention

This invention relates to determining the electrical condition of a battery.

2. Prior Art

Various systems using analog circuits are known to determine the state of charge of the battery. However, known systems have reduced accuracy because they do not take into account some significant parameters which affect the state of charge. This is very important in the question of electrically powered motor vehicles, because battery capacity corresponds to range.

U.S. Pat. No. 3,886,442 issued to Chiku et al. teaches a state of charge indicator circuit which employs the Peukert Equation in order to provide a measurement of the actual state of charge. The Peukert Equation relates the known fully charged battery capacity and the discharging battery current, and is used to determine a compensated current related to the discharge current. An ampere-hour parameter corresponding to a known fully charged battery capacity is stored. An actual state-of-charge of the battery is determined by detecting the difference between an ampere-hour parameter integrated from the compensated current and the stored ampere-hour parameter. The patent discloses analog circuitry which does not take into account the discharge history of the battery, the recuperation effect of the battery, the regeneration efficiency of the battery and age compensation.

U.S. Pat. No. 4,289,836 teaches a battery recharging system including a microprocessor which receives as inputs battery voltage, current and temperature signals. The flow of electrical energy to recharge the battery is controlled in response to various battery conditions.

Accurate indication of the amount of charge remaining in the battery is particularly desirable in electric vehicle traction batteries. The available charge is directly related to the range available from the vehicle before a recharge. Because of the limited range of the electric vehicle and also because recharging facilities are not available on the road, an accurate fuel gauge is particularly desirable.

U.S. Pat. No. 4,595,800 issued to Patil, and assigned to Ford Motor Company, the assignee of the present invention, discloses a method for computing the state of charge for a battery including the steps of sensing the battery voltage and current, and computing the used battery capacity $C_u$ and the average battery current $\bar{I}$. The total battery capacity $C_t$ is calculated from the average current by using the Peukert equation. The state of charge then is calculated as a function of $C_u/C_t$ to account for temperature and aging effects, recuperation effects, regeneration effects, and current variation effects. While this approach produces results that are more accurate than other prior art systems, it is most accurate under constant discharge conditions. Under widely varying discharge and recharge conditions, it tends to understate the remaining capacity in the battery.

These are some of the problems addressed and overcome by the present invention.

SUMMARY OF THE INVENTION

A microprocessor method is used to produce a very accurate state of charge indication. Inputs to the microprocessor include battery current and temperature signals from sensors. The microprocessor samples the net effective current several times every second. A fast average current $I_f$ is then calculated using an IIR filter on the net average current. A slow average current $\bar{I}$ is calculated by integrating the net average current over time with respect to time. The Ampere Hour Capacity is calculated by the use of the Peukert equation, which is split into two terms. A fast capacity term is calculated using the fast average current $I_f$ and a slow capacity term is calculated using the slow average current $\bar{I}$. The slow capacity term is then multiplied by a weighting constant $C_2$ and summed with the fast capacity term which is multiplied by a weighting constant $(1-C_2)$. In this manner, the slow average capacity term tracks the long-term average current drawn from the battery, while the fast capacity term accounts for short-term battery capacity variations corresponding to short-term current requirements and recharging.

Using these calculations the state of charge (SOC) for the storage battery may be calculated by measuring the Ampere Hours Consumed from the net discharge current I for the battery, and then calculating the ratio of the Ampere Hours Consumed to the Ampere Hour Capacity, and subtracting the result from 100%.

DETAILED DESCRIPTION OF THE INVENTION

Figure 1:
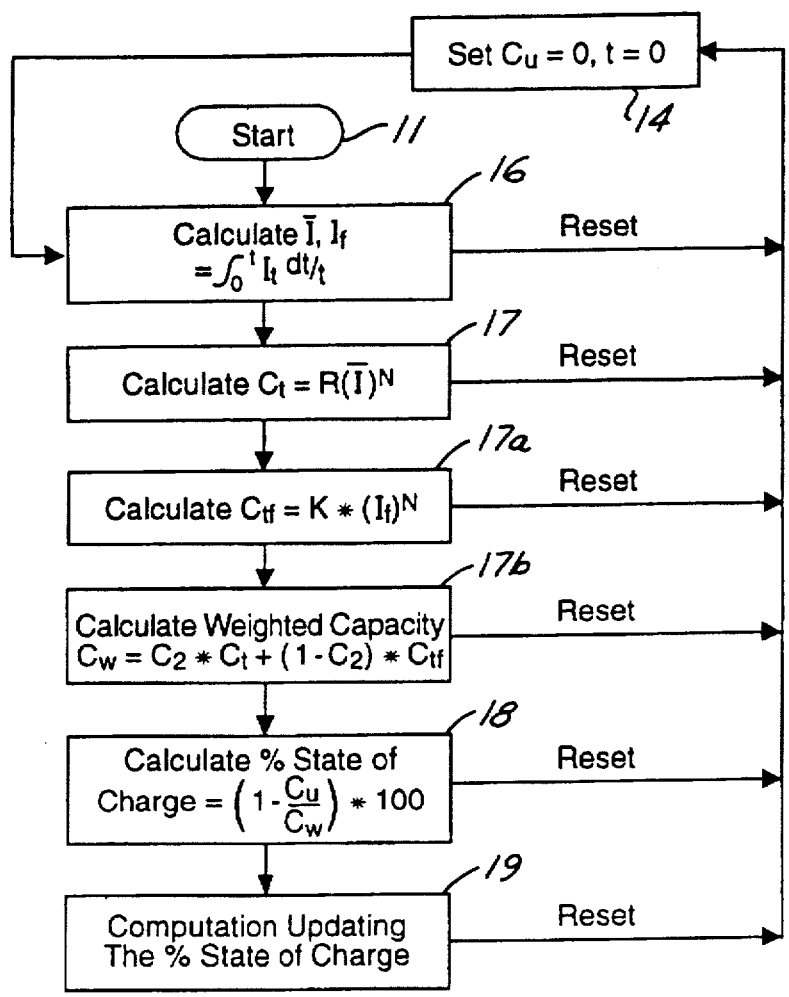
FIG. 1 is a logic flow diagram of the basic components of the method of computing state-of-charge of a battery in accordance with an embodiment of this invention.

In order to determine the State of Charge (SOC) of a lead-acid battery according to the proposed algorithm, two parameters are required: ampere hour capacity and ampere hours consumed. Given these variables, the SOC can be calculated as follows:

$$SOC = 100\% - \left( 100\% * \frac{\text{Amp Hours Consumed Total}}{\text{Amp Hours Capacity}} \right)$$

The Ampere Hours Consumed Total is obtained from an Iteration Model of the Instantaneous Current flowing into/out of the battery. This Instantaneous Current is sampled over known periods of time and added directly by the Iteration Model for current flowing from the battery. The Instantaneous Current flowing into the battery is sampled over known periods of time and then multiplied by a Recharge Efficiency Factor of less than one for 100% state of charge and equal to one for lower states of charge, and having a linear slope therebetween (see Box 31 in FIG. 2).

The Ampere Hour Capacity term is derived from two terms: a fast capacity and a slow capacity. These two terms are then assigned weights and the results are added to determine the Ampere Hour Capacity as follows:

Total Ampere Hour Capacity=$C_2$*slow capacity+$(1-C_2)$* fast capacity

To determine the values of slow capacity and fast capacity, several calculations are performed. First, a fast average current is calculated by taking an instantaneous reading of the net current I flowing from the battery, and then solving the following equation:

$$\text{Fast Average Current} = \frac{\text{Fast Average current} * C_1 + I}{1 + C_1}$$

Next, a slow average current is calculated by integrating the net current I over time, and then averaging the result. In the preferred mode of the process, the time period t is chosen to be equal to the time period since the last reset (typically, key on for the vehicle). The slow average current is then calculated as:

$$\text{Slow Average Current} = \int_o^t I \frac{dt}{t}$$

Under constant discharge currents, lead-acid batteries commonly have linear log capacity versus log current characteristics. This is known as the Peukert relationship, which sates that:

$$\text{Capacity} = P_1 * I^{(-P_2)}$$

Therefore, the fast capacity and the slow capacity terms can be calculated by inserting the fast and slow currents respectively into the Peukert equation above, yielding:

$$\text{Fast Capacity} = P_1 * (\text{fast average current})^{(-P_2)}$$

$$\text{Slow Capacity} = P_1 * (\text{slow average current})^{(-P_2)}$$

The terms $P_1$ and $P_2$ are the Peukert constants determined empirically to fit the characteristics of the battery.

Finally, as explained previously, the total Ampere Hour Capacity of the battery can be modeled using a weighted average of the two values:

$$\text{Total Ampere Hours Capacity} = C_2 * \text{slow capacity} + (1-C_2) * \text{fast capacity}$$

The SOC now can be calculated as:

$$SOC = 100\% - \left( 100\% * \frac{\text{Amp Hours Consumed Total}}{\text{Amp Hours Capacity}} \right)$$

As the discharge current changes from low to high, and vice versa, the Ampere Hour Capacity term will change accordingly. As a result, the SOC will change rapidly in response to varied discharge currents. Since these changes in SOC can be quite large at lower states of charge, it will be useful to display only the minimum SOC calculated in the last time interval. This serves to reduce fluctuations in the driver display system.

Figure 2:
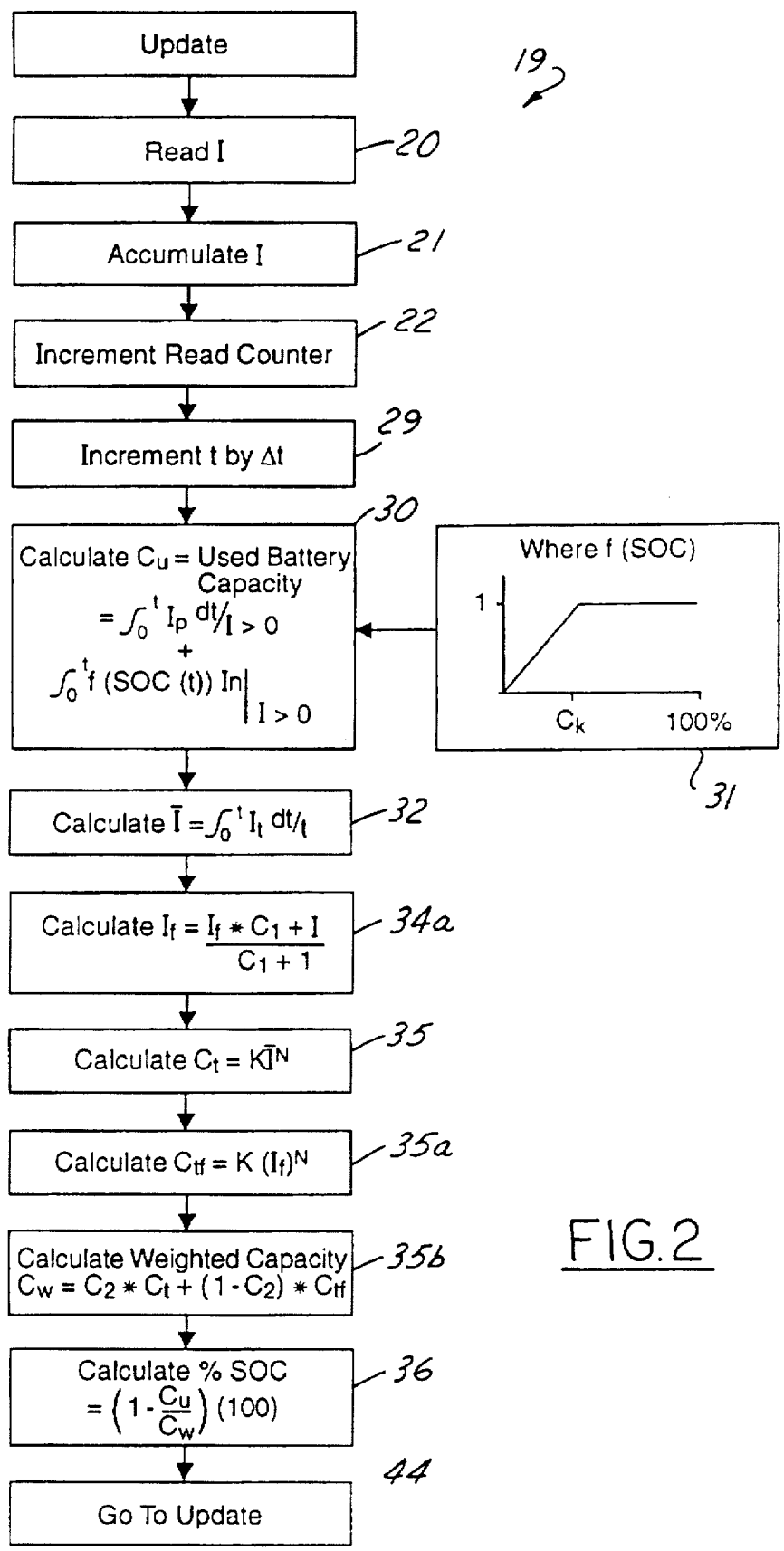
FIG. 2 is a logic flow diagrams of the last block of FIG. 1 wherein there is a computation updating the percent state of charge.

Referring now to FIG. 1, the initial steps for a computation of the state of charge in accordance with the present model are shown. Block 19 indicates an update computation of the percent state of charge. FIG. 2 shows a more detailed block diagram of the update computation for the percent state of charge.

A method of implementing this algorithm on a microcomputer will now be described with reference to FIGS. 1 and 2. The computation of FIG. 1 starts at block 11 by proceeding to block 16. In block 16, an average current $\bar{I}$ is computed by taking the integral, from zero to t, of the net battery current $I_t$ with respect to time. The fast-moving average current $I_f$, is set to the same value during the initial processing.

Next, in block 17 the total capacity $C_t$ is calculated using the Peukert equation, $C_t = K(\bar{I})^n$. In block 17a, the fast-moving total capacity is calculated as $C_{tf} = K*(I_f)^n$ using the same predetermined constants k and n as in block 17. In block 17b, the weighted capacity $C_w$ is calculated as a weighted average of $C_t$ and $C_{tf}$ using the equation, $C_w = C_2 * C_t + (1-C_2) * C_{tf}$.

In block 18, the percent of the state of charge, SOC, is calculated using the formula:

$$SOC = 100\% - \left( 100\% * \frac{\text{Amp Hours Consumed Total}}{\text{Amp Hours Capacity}} \right)$$

In block 19, the computation for updating the percent of the state of charge then is performed.

If a reset of the switch 34 (FIG. 3) occurs during the sequence shown in FIG. 1, then the program reinitializes by returning to block 14 to set $C_u$ to zero and t equal to zero. The reset function is indicated by arrows going to the right from blocks 16, 17, 17a, 17b, 18, and 19.

FIG. 2 shows a more detailed logic flow for the computation updating SOC. From block 18 of FIG. 1, the process moves to block 20 of FIG. 2, wherein the instantaneous net current I is read. In block 21, the value of I is added to the accumulated and previously read values of I stored in a memory. In block 22, a read counter is incremented to indicate another data reading. The number in the read counter indicates the number of times that the current information has been read.

In block 29, time t is incremented by delta t. At block 30, the used battery capacity $C_u$ is calculated. The net battery current used is a sum of two integrals: the first integral represents the positive current leaving the battery, and the second integral represents the negative current entering the battery. Note that the negative current, or charging current, is multiplied by an efficiency factor f(SOC), which is a function of state-of-charge, throughout the integration.

From block 30 the logic goes to block 32 where the average current $\bar{I}$ is calculated using the net current $I_t$ integrated from zero to t, with respect to time divided by the time.

In block 34a, the fast average current $I_f$ is calculated by applying an IIR filter to the instantaneous current I.

$$I_f = \frac{I_f * C_1 + I}{C_1 + 1}$$

At block 35, the total battery capacity $C_t$ is calculated by multiplying k times the average current $\bar{I}$ to the nth power. In block 35a, the fast-moving total capacity $C_{tf}$ is calculated as $K \cdot I_f^n$ using the same predetermined constants K and n as in block 35. In block 35b, the weighted capacity $C_w$ is calculated as a weighted average of $C_t$ and $C_{tf}$ by using the formula $C_w = C_2 \cdot C_t + (1-C_2) \, C_{tf}$ At block 36, the percent of the State Of Charge is calculated by multiplying the quantity $(1 - C_u/C_w)$ by 100. Block 44 contains an instruction to return to the beginning of the loop within major block 19.

Summarizing the preceding logic flow, signals from current sensors are coupled to a battery to be tested or sampled many times a second, typically 100 times per second. These current data are averaged to eliminate the effects of chopping waveforms used in electric vehicles. The signal representing current I is digitally integrated with respect to time t every second to compute the used capacity $C_u$:

$$C_u = \int_o^t I \cdot dt$$

The average current $\bar{I}$ is computed:

$$\bar{I} = \int_o^t I_t \frac{dt}{t}$$

The average current value is used to calculate the total battery capacity $C_t$ using the Peukert equation:

$$C_t = K \cdot (\bar{I})^n$$

where K and n are Peukert constants determined experimentally for each battery.

The fast-moving average current value $I_f$ is used to calculate a fast-moving total battery capacity as $C_{tf} = K (I_f)^n$.

These terms are then averaged and summed to yield the weighted ampere hour capacity $C_w = C_2 \cdot C_t + (1-C_2) \cdot C_{tf}$. The state of charge SOC is then calculated by:

$$SOC = 100\% - \left( 100\% * \frac{\text{Amp Hours Consumed Total}}{\text{Amp Hours Capacity}} \right)$$

In the preferred embodiment, the short term averages are measured over a time period of approximately 10 seconds, but this period could range from about 5 seconds to more than 30 seconds. The long term averages are measured over a much longer time period (at least ten to one hundred times longer), such as a time period corresponding to the period that the vehicle electronics are operating (typically, key on to key off time). Weighting constant $C_2$ has been determined to be approximately 0.69 for the best fit for a typical electric vehicle traction battery. Using this constant, this model of SOC is within 2% of the actual measured end-of-charge condition of a Delphi 12 volt Electric Vehicle battery for all discharge cycles tested. Testing was verified using several discharge cycles, including constant-current discharge and widely varied discharge profiles. The results of this SOC model should be used as a "minimum value". The minimum output value should be used to predict the SOC of the battery. As a result, this technique accounts for the recuperation effects (such as when the current being drawn is zero) through the equation at block 35a, and the regeneration effects (such as when the current is negative) through blocks 20 through 35, and current variation effects through the averaging process of blocks 32 and 34a.

Figure 3:
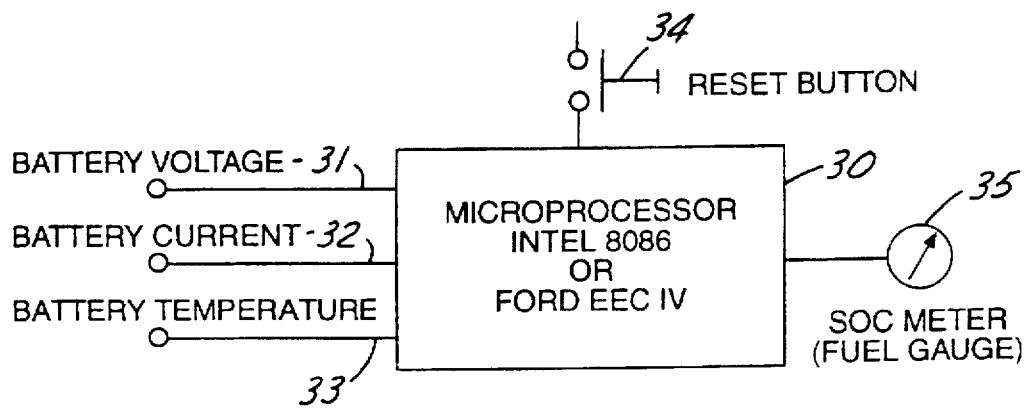
FIG. 3 is a functional block diagram of a state of charge apparatus in accordance with an embodiment of this invention.

Referring to FIG. 3, a circuit block diagram includes a microprocessor 30 having inputs of battery current 32 and battery temperature 33. Note that battery voltage need not be monitored in the solution of this algorithm. Also applied to the microprocessor 30 is a reset button 34. An output from the microprocessor is normally a state of charge meter or fuel gauge 35. The apparatus of FIG. 3 is adapted to execute the method or algorithm described in FIGS. 1 and 2.

Various modifications and variations will no doubt occur to those skilled in the art to which this invention pertains. For example, a particular sequence of the steps may be varied from that disclosed herein. These and all other variations which basically rely on the teachings through which this disclosure has advanced the art are properly considered within the scope of this invention.

We claim:

1. A method for computing the capacity for a storage battery, comprising the steps of:

measuring the net discharge current I for the operating battery, calculating a fast average current $I_f$ using the equation $$I_f = \frac{I_f * C_1 + I}{C_1 + 1},$$

where $C_1$ is a constant matched with the battery characteristics, calculating a slow average current $\bar{I}$ using the equation $$\bar{I} = \int_o^t \frac{Idt}{t},$$

and calculating the Ampere Hour Capacity using the equation

Ampere Hour Capacity $= C_2 * P_1(\bar{I})^{-P_2} + (1-C_2) * P_1(I_f)^{-P_2}$ where $P_1$ and $P_2$ are Peukert constants, and $C_2$ is a weighting constant, determined to match the operating characteristics of the battery being measured.

2. The method as described in claim 1 wherein the fast average current $I_f$ is calculated by using an IIR filter on the value of the net discharge current I.

3. The method as described in claim 1 wherein the fast average current $I_f$ is calculated over a time period as short as 5 seconds to as long as 30 seconds.

4. The method as described in claim 3 wherein the slow average current $\bar{I}$ is calculated for an effective time period at least 10 times longer than the time period for calculating the fast average current $I_f$.

5. The method as described in claim 4 wherein the slow average current $\bar{I}$ is calculated for an effective time period of at least 30 minutes.

6. The method as described in claim 4 wherein the slow average current $\bar{I}$ is calculated for an effective time period defined from approximately key on to key off for an electrically powered vehicle in which the battery is used for storing electrical energy.

7. A method for computing the Ampere Hour Capacity for a storage battery of the type used as an energy source for the propulsion system of an electric vehicle, comprising the steps of:

measuring the net discharge current I for the operating battery, calculating a fast average current $I_f$ using the equation $$I_f = \frac{I_f * C_1 + I}{C_1 + 1},$$

where $C_1$ is a constant matched with the battery characteristics, with the fast average current $I_f$ being calculated over a time period from as short as 5 seconds to as long as 60 seconds, calculating a slow average current $\bar{I}$ using the equation $$\bar{I} = \int_o^t \frac{Idt}{t},$$

with the slow average current $\bar{I}$ calculated for an effective time period of at least 100 times longer than the time period for calculating the fast average current $I_f$, and calculating the Ampere Hour Capacity using the equation $$\text{Ampere Hour Capacity} = C_2 * P_1(\bar{I})^{-P_2} + (1-C_2) * P_1(I_f)^{-P_2}$$

where $P_1$ and $P_2$ are Peukert constants and $C_2$ is a weighting constant determined to match the operating characteristics of the battery being measured.

8. The method as described in claim 7 wherein the slow average current $\bar{I}$ is calculated for an effective time period defined from approximately key on to key off for an electrically powered vehicle.

9. A method for calculating the State of Charge (SOC) for a storage battery used as an energy source for the propulsion system of an electric vehicle, comprising the steps of:

measuring the net discharge current I for the operating battery, calculating a fast average current $I_f$ using the equation $$I_f = \frac{I_f * C_1 + I}{C_1 + 1},$$

where $C_1$ is a constant matched with the battery characteristics, calculating a slow average current $\bar{I}$ using the equation $$\bar{I} = \int_0^t \frac{I dt}{t},$$

and calculating the Ampere Hour Capacity using the equation $$\text{Ampere Hour Capacity} = C_2 * P_1(\bar{I})^{-P_2} + (1-C_2) * P_1(I_f)^{-P_2}$$

where $P_1$ and $P_2$ are Peukert constants and $C_2$ is a weighting constant determined to match the operating characteristics of the battery being measured, measuring the Ampere Hours Consumed from the net discharge current I for the battery, and calculating the State of Charge (SOC) using the equation $$SOC = 100\% - \left( 100\% * \frac{\text{Amp Hours Consumed Total}}{\text{Amp Hours Capacity}} \right)$$

10. The method as described in claim 9 wherein the fast average current $I_f$ is calculated over a time period as short as 5 seconds to as long as 30 seconds.

11. The method as described in claim 10 wherein the slow average current $\bar{I}$ is calculated for an effective time period at least 10 times longer than the time period for calculating the fast average current $I_f$.

12. The method as described in claim 10 wherein the slow average current $\bar{I}$ is calculated for an effective time period of at least 30 minutes.

13. The method as described in claim 10 wherein the slow average current $\bar{I}$ is calculated for an effective time period defined from approximately key on to key off for an electrically powered vehicle in which the battery is used for storing electrical energy.

14. The method as described in claim 9 wherein the fast average current $I_f$ is calculated by using an IIR filter on the value of the net discharge current I.

* * * * *